US010229306B2

(12) United States Patent
Kim et al.

(10) Patent No.: US 10,229,306 B2
(45) Date of Patent: Mar. 12, 2019

(54) FINGERPRINT RECOGNITION DEVICE, METHOD OF MANUFACTURING THE SAME, AND ELECTRONIC DEVICE THEREOF

(71) Applicant: SAMSUNG ELECTRONICS CO., LTD., Suwon-si, Gyeonggi-do (KR)

(72) Inventors: Il Kim, Incheon (KR); Young Jun Moon, Hwaseong-si (KR); Tae Sang Park, Seoul (KR); Kyung Woon Jang, Suwon-si (KR); Seung Hee Oh, Seoul (KR); Chang Kyu Chung, Suwon-si (KR); Dong Yul Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 26 days.

(21) Appl. No.: 15/114,982

(22) PCT Filed: Sep. 15, 2014

(86) PCT No.: PCT/KR2014/008585
§ 371 (c)(1),
(2) Date: Jul. 28, 2016

(87) PCT Pub. No.: WO2015/115716
PCT Pub. Date: Aug. 6, 2015

(65) Prior Publication Data
US 2016/0350572 A1 Dec. 1, 2016

(30) Foreign Application Priority Data

Jan. 29, 2014 (KR) .................. 10-2014-0011408
Mar. 4, 2014 (KR) .................. 10-2014-0025721

(51) Int. Cl.
G06K 9/00 (2006.01)
G06F 1/16 (2006.01)
G06F 3/0354 (2013.01)

(52) U.S. Cl.
CPC .......... *G06K 9/0002* (2013.01); *G06F 1/169* (2013.01); *G06F 3/03547* (2013.01); *G06F 2203/0338* (2013.01)

(58) Field of Classification Search
CPC ............................. G06K 9/0002; G06K 9/00
See application file for complete search history.

(56) References Cited

U.S. PATENT DOCUMENTS 8,791,792 B2 * 7/2014 Benkley, III ....... G06K 9/00053
324/658
8,866,347 B2 * 10/2014 Benkley, III ........... G01N 27/04
307/116

(Continued)

FOREIGN PATENT DOCUMENTS

CN 2768086 3/2006
CN 1802882 7/2006

(Continued)

OTHER PUBLICATIONS

Notice of Acceptance dated Apr. 24, 2017 in related Australian Patent Application No. 2014380483 (3 pages).

(Continued)

*Primary Examiner* — Mia M Thomas
(74) *Attorney, Agent, or Firm* — Staas & Halsey LLP

(57) ABSTRACT

A fingerprint recognition device includes: an integrated circuit electrically connected to at least one sensor electrode; a first circuit board located at an upper portion of the integrated circuit and provided with the at least one sensor electrode; a second circuit board electrically connected to the first circuit board and located at under the integrated circuit; a molding layer provided under the first circuit board (Continued)

to surround the integrated circuit so as to protect the integrated circuit from the outside; and a connection part electrically connecting the first circuit board and the second circuit board.

19 Claims, 20 Drawing Sheets

(56) References Cited

U.S. PATENT DOCUMENTS

| | | | |
|---|---|---|---|
| 8,867,799 B2* | 10/2014 | Benkley, III | G06K 9/00053 |
| | | | 382/107 |
| 9,001,040 B2* | 4/2015 | Dean | G06F 3/03547 |
| | | | 345/161 |
| 9,122,901 B2* | 9/2015 | Slogedal | G06K 9/0002 |
| 9,268,988 B2* | 2/2016 | Benkley | G01N 27/04 |
| 9,594,498 B2* | 3/2017 | Dean | G06F 3/03547 |
| 9,600,704 B2* | 3/2017 | Benkley, III | G06K 9/0002 |
| 9,792,481 B2* | 10/2017 | Lin | G06K 9/00013 |
| 9,793,465 B2* | 10/2017 | Wang | H01L 41/1132 |
| 9,798,917 B2* | 10/2017 | Benkley, III | G06K 9/00026 |
| 9,819,424 B2* | 11/2017 | Balasubramanian | H04B 15/02 |
| 2005/0253224 A1* | 11/2005 | Ho | H01L 25/0657 |
| | | | 257/666 |
| 2008/0278921 A1* | 11/2008 | Shin | H01L 23/13 |
| | | | 361/761 |
| 2009/0257626 A1 | 10/2009 | Sherlock et al. | |
| 2010/0039121 A1 | 2/2010 | Iliev et al. | |
| 2011/0175703 A1* | 7/2011 | Benkley, III | G06K 9/00053 |
| | | | 340/5.82 |
| 2011/0298711 A1* | 12/2011 | Dean | G06F 3/03547 |
| | | | 345/161 |
| 2011/0304001 A1 | 12/2011 | Erhart et al. | |
| 2011/0309482 A1 | 12/2011 | Salatino et al. | |
| 2012/0092350 A1* | 4/2012 | Ganapathi | G02B 26/0833 |
| | | | 345/501 |
| 2012/0256280 A1 | 10/2012 | Erhart et al. | |
| 2012/0321149 A1* | 12/2012 | Carver | G06K 9/0004 |
| | | | 382/124 |
| 2014/0333328 A1* | 11/2014 | Nelson | G06F 3/044 |
| | | | 324/663 |
| 2015/0153923 A1* | 6/2015 | Dean | G06F 3/03547 |
| | | | 382/126 |

FOREIGN PATENT DOCUMENTS

| | | |
|---|---|---|
| CN | 101047153 | 10/2007 |
| CN | 103038782 | 4/2013 |
| JP | 2006-158976 A | 6/2006 |
| JP | 2006-517023 | 7/2006 |
| KR | 10-2011-0138402 | 12/2011 |
| KR | 10-2012-0106629 | 9/2012 |
| KR | 10-2013-0043161 | 4/2013 |
| TW | 201207743 | 2/2012 |
| TW | 201246410 | 11/2012 |
| WO | 2004/066693 A1 | 8/2004 |
| WO | WO 2015/115716 A1 | 8/2015 |

OTHER PUBLICATIONS

Reissued Correspondence (Replacement) of Notice of Acceptance dated Aug. 29, 2017 in related Australian Patent Application No. 2014380483 (4 pages).
International Search Report (Form PCT/ISA/210) dated Dec. 12, 2014 in corresponding International Patent Application No. PCT/KR2014/008585 (3 pages) (2 pages English Translation).
Written Opinion of the International Searching Authority (Form PCT/ISA/237 dated Dec. 12, 2014 in corresponding International Patent Application No. PCT/KR2014/008585 (10 pages) (18 pages English Translation).
Australian Examination Report dated Dec. 12, 2016 in related Australian Patent Application No. 2014380483 (4 pages).
Extended European Search Report dated Oct. 2, 2017 in corresponding European Patent Application No. 14881377.7.
Japanese Office Action dated Sep. 4, 2018 in Japanese Patent Application No. 2016-548162.
Korean Office Action dated Oct. 29, 2018 in Korean Patent Application No. 10-2014-0025721.
Chinese Office Action dated Dec. 27, 2018 in Chinese Patent Application No. 201480074552.5.

* cited by examiner

FINGERPRINT RECOGNITION DEVICE, METHOD OF MANUFACTURING THE SAME, AND ELECTRONIC DEVICE THEREOF

CROSS-REFERENCE TO RELATED APPLICATIONS

This application is a U.S. National stage application of PCT international application PCT/KR2014/008585, filed on Sep. 15, 2014 and claims the benefits of Korean Patent Application No 10-2014-0011408, filed on Jan. 29, 2014, and Korean Patent Application No. 10-2014-0025721, filed on Mar. 4, 2014, respectively, the contents are incorporated herein by reference.

BACKGROUND

1. Technical Field

The present invention relates to a fingerprint recognition device, a method of manufacturing the same, and an electronic device, and more particularly, to a fingerprint recognition device having an improved structure and durability against physical and environmental factors, a method of manufacturing the same, and an electronic device.

2. Background Art

Generally, portable terminals such as a mobile terminal, a personal digital assistant (PDA), a tablet PC, and the like adopt user interfaces through a key pad, a touch pad, and the like.

Recently, in order to support a communication service or an internet service using a portable terminal, wireless internet services such as a wireless broadband (WIBRO) and mobile communication services are commercialized, and operating systems such as Windows mobile, Android, and the like are adopted in the portable terminals such as mobile terminals, PDAs, and the like in order to support a graphical user interface (GUI).

Also, with the development of communication technology, portable terminals provide various supplementary services to users, and a GUI based operating system provides convenience in supplying supplementary services through portable electronic devices.

In addition, for easier use of electronic devices a pointing devices that are applied to electronic devices to move a pointer such as a cursor or input information or a command desired by the user by sensing a signal that changes based on movement of a finger which is an object are used.

In a pointing device, a sensor is adopted in order to sense a change of the finger and move a cursor (a pointer on a screen), and a dome switch or the like is also installed in order to select a menu or an icon on which the cursor is located.

Generally, fingerprint recognition technology is technology for processing user registration and an identification process to prevent security incidents, and is applied in network defense for individuals or groups, protection of content and data, and safe access of computers, mobile devices, and the like.

Recently, with the development of mobile technology, fingerprint recognition technology is applied to pointing device bio track pads (BTPs) which detect image data of fingerprints and perform pointer operations, and thus has come into wide use.

For the above fingerprint technology, a fingerprint sensor is applied as a sensor of a pointing device as a device configured to recognize a pattern of a fingerprint of a human finger, and fingerprint recognition sensors can be classified based on a sensing principle as optical sensors, electric (electrostatic capacitor type and conductive type) sensors, ultrasonic type sensors, and temperature sensing type sensors, and the fingerprint recognition of each type obtains fingerprint image data from the finger based on its operating principle.

In a pointing device including a fingerprint recognition sensor, package processes of various methods in each type are proposed, but since the electric sensor has individual parts including an integrated circuit, developing package technology is harder than for other types of sensors. A wafer level fan-out package process is proposed as a package technology of the fingerprint recognition sensor including the integrated circuit, but when the wafer level fan-out package process is used, a driving unit part of the integrated circuit is positioned close to a surface exposed to the outside. Thus, when the pointing device manufactured by the wafer level fan-out package process is used in an electronic device such as a button on which impact is applied periodically, damage of the driving device of the integrated circuit is unavoidable.

Also, in the wafer level fan-out package process, as an area of the pointing device is greater than that of the integrated circuit, efficiency of relocating I/O of the integrated circuit on the wafer is decreased, and thus a manufacturing cost is increased. Since the area of the integrated circuit of the pointing device is small, economic loss is great when the wafer level fan-out package process is used to realize a button shape of a predetermined size such as a home key of a smartphone.

Related art is Korean Patent Laid Open Publication No. 10-2011-0055364 ("POINTING DEVICE AND ELECTRONIC DEVICE").

SUMMARY

The present invention is directed to providing a fingerprint recognition device having an improved structure configured to be used as a mechanical button, a method of manufacturing the same, and an electronic device.

The present invention is directed to providing a fingerprint recognition device having an improved structure in which a driving unit of an integrated circuit has durability, a method of manufacturing the same, and an electronic device.

One aspect of the present invention provides a fingerprint recognition device including an integrated circuit electrically connected to at least one sensor electrode; a first circuit substrate disposed on an upper portion of the integrated circuit and on which the at least one sensor electrode is provided; a second circuit substrate electrically connected to the first circuit substrate and disposed under the integrated circuit; a molding layer provided under the first circuit substrate and surrounding the integrated circuit to protect the integrated circuit from the outside; and a connecting part electrically connecting the first circuit substrate to the second circuit substrate.

The first circuit substrate may include a structure in which a plurality of circuit layers are rearranged to transmit a signal sensed by the at least one sensor electrode to the integrated circuit.

The at least one sensor electrode may be provided on a surface of the first circuit substrate which is exposed to the outside.

The at least one sensor electrode may be provided in the first circuit substrate and be adjacent to a surface of the first circuit substrate which is exposed to the outside.

Also, at least one signal transmission path may be formed on the first circuit substrate to transmit the signal sensed by the at least one sensor electrode to the integrated circuit, and the at least one signal transmission path may include a first circuit layer on which the at least one sensor electrode is disposed; a second circuit layer on which an electrode provided under the first circuit substrate is disposed; and a micro via electrically connecting the first circuit to the second circuit.

The at least one signal transmission path may further include at least one third circuit layer disposed between the first circuit layer and the second circuit layer, and the micro via may electrically connect the first circuit layer, the at least one third circuit layer, and the second circuit layer which have a stacked structure.

In order to transmit the signal sensed by the at least one sensor electrode to the integrated circuit through the at least one signal transmission path, the electrode may be electrically connected to the integrated circuit through a connecting member.

The connecting member may include a solder bump.

The fingerprint recognition device of the present invention may further include an underfill resin layer formed between the integrated circuit and a lower surface of the first circuit substrate facing the integrated circuit in order to reinforce durability of the connecting member.

The second substrate may include a rigid printed circuit board, a flexible printed circuit board, a rigid-flexible printed circuit board, and a rigid-flexible separated-connected printed circuit board.

The connecting part may include at least one among a through mold via and a solder ball which pass through the molding layer and electrically connects the first circuit substrate to the second circuit substrate.

The connecting part may be connected to the second circuit substrate through one of a gold-tin eutectic connection, an ACA/NCA connection, a solder connection, and a gold-gold connection.

Various colors may be realized on an upper portion of the first circuit substrate in order to improve esthetics for a user.

The first circuit substrate and the molding layer may include a ceramic or metal filler to reinforce durability.

A receiving recess recessed toward the integrated circuit may be formed on a bottom surface of the molding layer, and the second circuit substrate may be received in the receiving recess and separated from a structure disposed under of the molding layer.

The receiving recess and the second circuit substrate received in the receiving recess may be bent.

The receiving recess may be formed on a central portion of the bottom surface of the molding layer.

The receiving recess may be formed on a side portion of the bottom surface of the molding layer.

The receiving recess may be formed on one end portion of the bottom surface of the molding layer.

A connecting part protruding toward the structure or recessed toward the integrated circuit may be formed on the bottom surface of the molding layer to connect the molding layer to the structure.

The fingerprint recognition device may further include a fixing layer configured to fix the second circuit substrate to the receiving recess, and the fixing layer may be formed between the receiving recess and the second circuit substrate or formed under the second circuit substrate to face the structure.

The fixing layer may surround the second circuit substrate received in the receiving recess.

The fixing layer may include at least one among an epoxy resin, an acrylic resin, a silicone resin, and a urethane resin.

The fixing layer may be formed between the receiving recess and the second circuit substrate to cover a portion of the second circuit substrate.

At least one of a recessed portion and a punching portion may be formed on the second circuit substrate, and the at least one of the recessed portion and the punching portion may be filled by the molding layer.

The at least one of the recessed portion and the punching portion may be disposed under the integrated circuit and correspond to the integrated circuit.

The molding layer may surround the second circuit substrate.

The fingerprint recognition device may further include a reinforcing layer of metallic material disposed under the second circuit substrate or the molding layer.

Another aspect of the present invention provides a fingerprint recognition device including an integrated circuit electrically connected to at least one sensor electrode; a first circuit substrate disposed on an upper portion of the integrated circuit and including at least one signal transmission path configured to transmit a signal sensed by the at least one sensor electrode to the integrated circuit; a connecting member disposed between the integrated circuit and the first circuit substrate to electrically connect the integrated circuit to the first circuit substrate; and a molding layer provided under the first circuit substrate and surrounding the integrated circuit and the connecting member to protect the integrated circuit from the outside.

A receiving recess recessed toward the integrated circuit may be formed on a bottom surface of the molding layer, and one end portion of the first circuit substrate may be bent to face a lower surface of the integrated circuit and received in the receiving recess.

One end portion of the first circuit substrate may be bent away from the integrated circuit along the molding layer.

The first circuit substrate may include a structure in which a plurality of circuit layers are rearranged to transmit a signal sensed by the at least one sensor electrode to the integrated circuit, and the first circuit substrate may include a rigid-flexible printed circuit board and a rigid-flexible separated-connected printed circuit board.

Still another aspect of the present invention provides a method of manufacturing a fingerprint recognition device, including electrically connecting an integrated circuit to a first circuit substrate on which at least one sensor electrode is provided through a connecting member; and forming a molding layer configured to surround the integrated circuit on the first circuit substrate and protect the integrated circuit from the outside.

The first circuit substrate may be formed by stacking a plurality of circuit layers.

Yet another aspect of the present invention provides a method of manufacturing a fingerprint recognition device, including electrically connecting an integrated circuit to a first circuit substrate on which at least one sensor electrode is provided through a connecting member; forming a molding layer configured to surround the integrated circuit on the first circuit substrate of the plurality of layers to protect the integrated circuit from the outside, and forming a connecting part including one end portion coming in contact with the first circuit substrate of the plurality of layers; and electrically connecting the first circuit substrate of the plurality of layers to a second circuit substrate to bring the other end portion of the connecting part in contact with the second circuit substrate.

Yet another aspect of the present invention provides a method of manufacturing a fingerprint recognition device, including electrically connecting an integrated circuit to a first circuit substrate on which at least one sensor electrode is provided through a connecting member; forming a connecting part including one end portion coming in contact with the first circuit substrate of the plurality of layers; electrically connecting the first circuit substrate of the plurality of layers to a second circuit substrate to bring the other end portion of the connecting part in contact with the second circuit substrate; and forming a molding layer configured to surround the integrated circuit and the second circuit substrate on the first circuit substrate of the plurality of layers to protect the integrated circuit from the outside.

Yet another aspect of the present invention provides an electronic device using a fingerprint recognition device, the fingerprint recognition device includes an integrated circuit electrically connected to at least one sensor electrode; a first circuit substrate disposed on an upper portion of the integrated circuit and on which the at least one sensor electrode is provided; a second circuit substrate electrically connected to the first circuit substrate and disposed under the integrated circuit; and a molding layer provided under the first circuit substrate and surrounding the integrated circuit to protect the integrated circuit from the outside, and wherein a curved surface is formed at a periphery of the fingerprint recognition device.

A receiving recess recessed toward the integrated circuit may be formed on a bottom surface of the molding layer, and the second circuit substrate may be received in the receiving recess and spaced apart from the structure.

The first circuit substrate may be integrally formed with the second circuit substrate.

The fingerprint recognition device may further include a connecting part electrically connecting the first circuit substrate to the second circuit substrate.

The electronic device may further include a coating layer provided on the first circuit substrate to realize various colors and patterns.

The molding layer may surround the second circuit substrate.

Since a first circuit substrate including a plurality of circuit layers is used, a driving unit of an integrated circuit which is vulnerable to external impact is separated from the outside, and thus damage of the driving unit of the integrated circuit may be prevented.

Since a manufacturing process is simpler than a wafer level fan-out package process through which a fingerprint recognition device is manufactured, a manufacturing time is decreased, thereby being more economic.

DESCRIPTION OF EMBODIMENTS

Hereinafter, embodiments of the present invention will be described in detail with reference to accompanying drawings.

Figure 1:
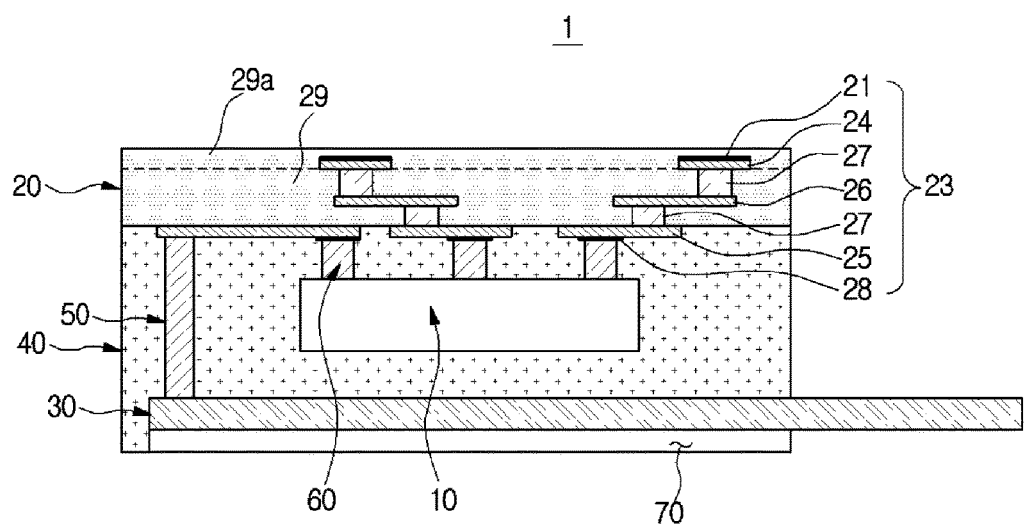
FIG. 1 is a cross-sectional view illustrating a fingerprint recognition device according to one embodiment of the present invention.
Figure 2A:
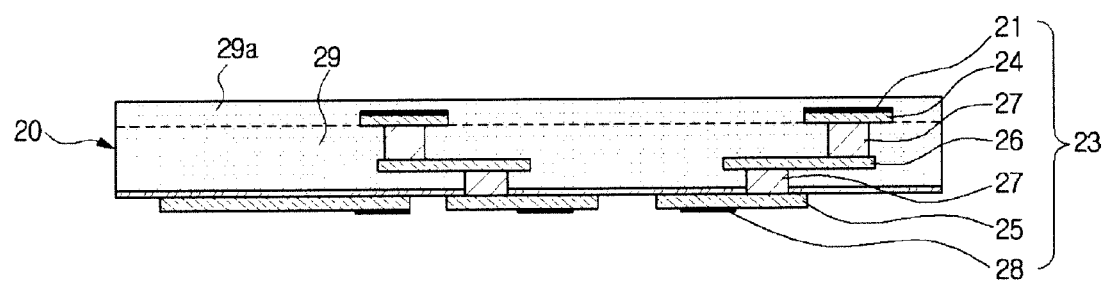
FIGS. 2A and 2B are enlarged views illustrating parts of the fingerprint recognition device according to one embodiment of the present invention.
Figure 2B:
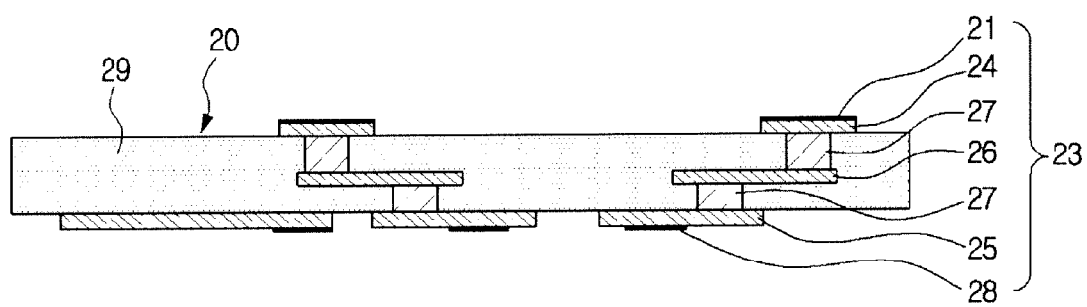
Figure 3:
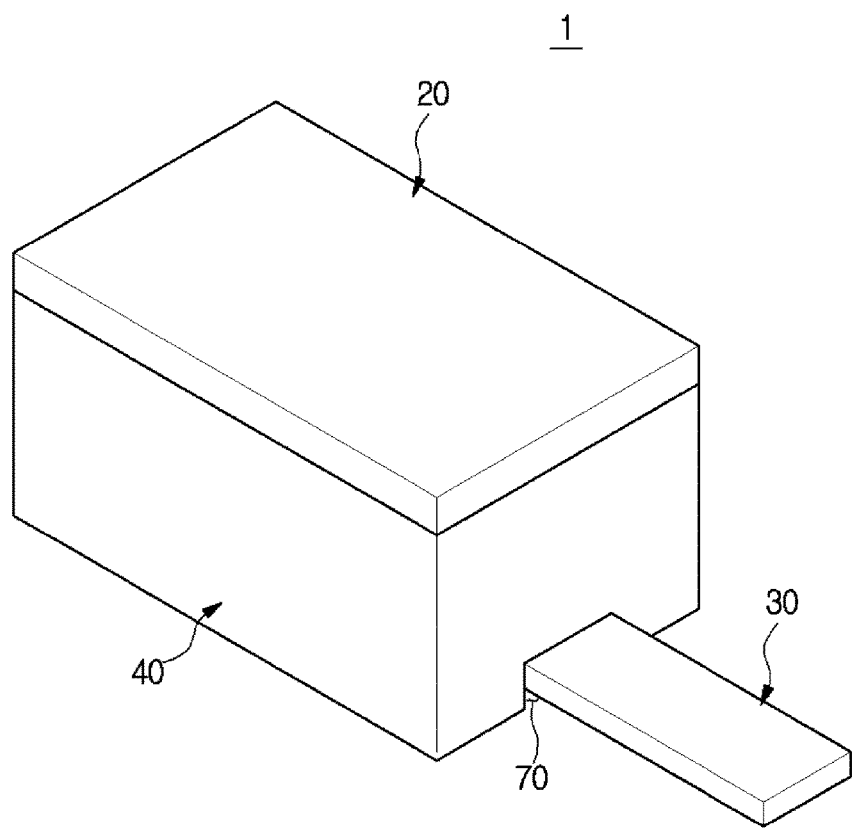
FIG. 3 is a perspective view illustrating an external shape of a fingerprint recognition device according to one embodiment of the present invention.
Figure 4:
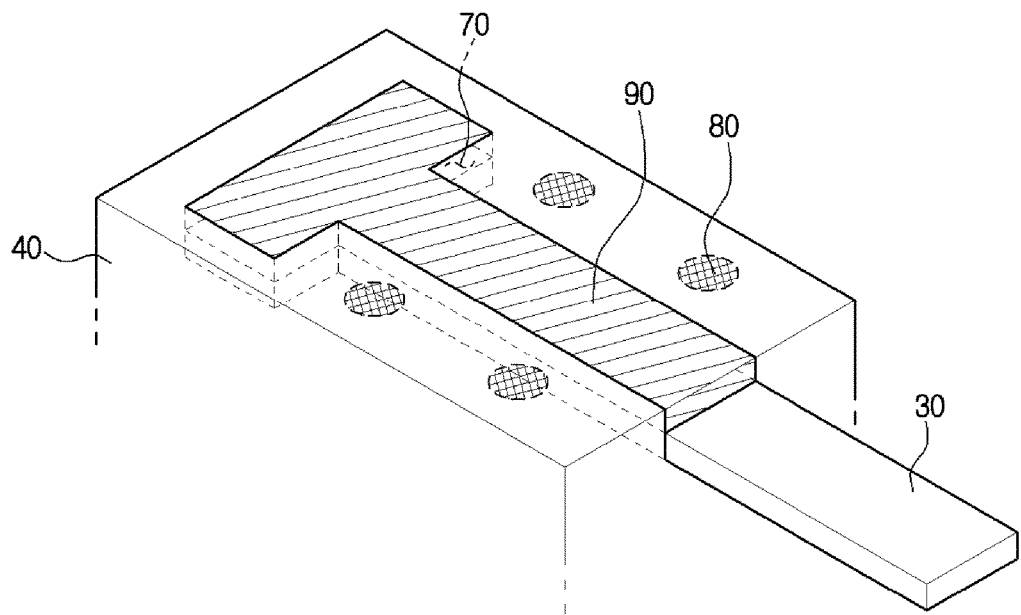
FIG. 4 is a view illustrating a bottom surface of the fingerprint recognition device shown in FIG. 3.
Figure 5A:
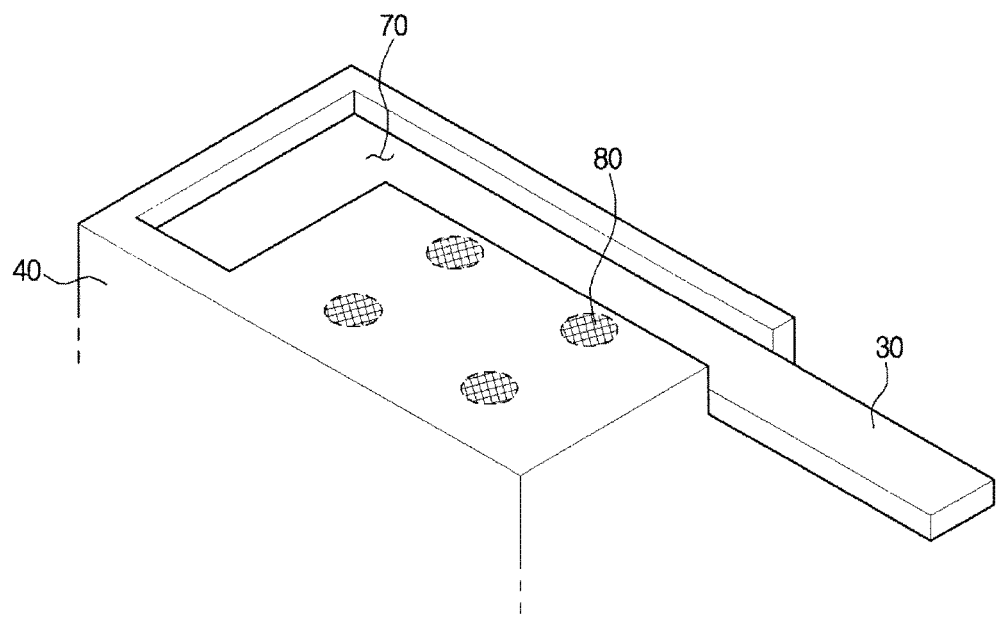
FIGS. 5A and 5B are views illustrating bottom surfaces of a fingerprint recognition device according to another embodiment of the present invention.
Figure 5B:
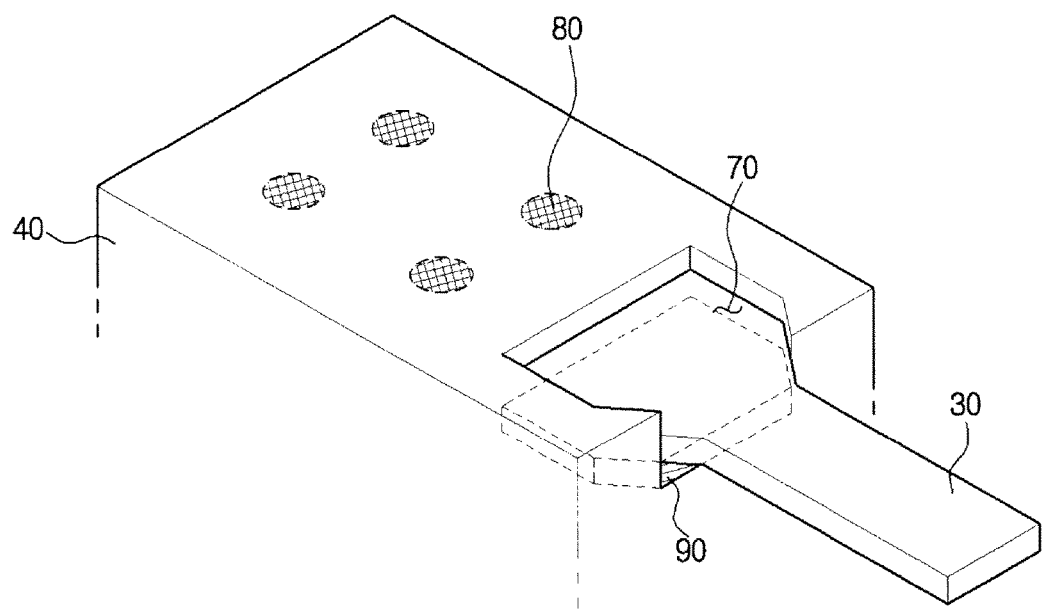

FIG. 1 is a cross-sectional view illustrating a fingerprint recognition device according to one embodiment of the present invention, and FIGS. 2A and 2B are enlarged views illustrating parts of the fingerprint recognition device according to one embodiment of the present invention.

As shown in FIGS. 1, 2A, and 2B, a fingerprint recognition device 1 may include an integrated circuit 10, a first circuit substrate 20, a second circuit substrate 30, a molding layer 40, and a connecting part 50.

The first circuit substrate 20 may include at least one sensor electrode 21. The at least one sensor electrode 21 senses an electrostatic signal derived from ridges and valleys of a fingerprint. The signal sensed by the at least one sensor electrode 21 may be transformed into an electric signal and amplified by an amplifier (not shown), and may be transmitted to a microcomputer of the fingerprint recognition device 1 through a connector such as the connecting part 50 or the second circuit substrate 30.

The signal sensed by the at least one sensor electrode 21 is transmitted to the integrated circuit 10 electrically connected to the at least one sensor electrode 21. The integrated circuit 10 performs an operation of calculating the signal sensed by the at least one sensor electrode 21.

The first circuit substrate 20 disposed on an upper portion of the integrated circuit 10 may have a structure in which a plurality of circuit layers 24, 25, and 26 are stacked. The plurality of circuit layers 24, 25, and 26 included in the first circuit substrate 20 may transmit the signal sensed by the at least one sensor electrode 21 to the integrated circuit 10 disposed under the first circuit substrate 20 through a rearrangement process. Also, a driving unit (not shown) of the integrated circuit 10 which is easily damaged by external impact may be spaced from a surface of the first circuit substrate 20 that may be touched by a portion of a body of a user by a thickness of the plurality of circuit layers 24, 25, and 26 forming the first circuit substrate 20, and thus may be protected from external impact.

In order to transmit the signal sensed by the at least one sensor electrode 21 to the integrated circuit 10, at least one signal transmission path 23 may be formed in the first circuit substrate 20. The at least one signal transmission path 23 may include a first circuit layer 24, a second circuit layer 25, and a micro via 27.

The at least one sensor electrode 21 may be disposed on the first circuit layer 24, and at least one electrode 28 may be disposed on the second circuit layer 25 which is provided under the first circuit layer 24. The first circuit layer 24 and the second circuit layer 25 may be electrically connected through the micro via 27.

The at least one signal transmission path 23 may further include at least one third circuit layer 26. The at least one third circuit layer 26 may be disposed between the first circuit layer 24 and the second circuit layer 25. The first circuit layer 24, the at least one third circuit layer 26, and the second circuit layer 25 may have a stacked structure in a direction toward the integrated circuit 10, and the micro via 27 electrically connects the first circuit layer 24, the at least one third circuit layer 26, and the second circuit layer 25.

The first circuit layer 24, the at least one third circuit layer 26, and the second circuit layer 25 may be formed on a metal layer, and the micro via 27 may be formed through a resin layer 29. In particular, the micro via 27 passes through the resin layer 29 and electrically connects the first circuit layer 24, the at least one third circuit layer 26, and the second circuit layer 25.

The number of the plurality of circuit layers 24, 25, and 26 included in the first circuit substrate 20 may be counted with reference to the number of metal layers in which the first circuit layer 24, the at least one third circuit layer 26, and the second circuit layer 25 are provided.

The number of the plurality of circuit layers 24, 25, and 26 is not limited to three.

The first circuit substrate 20 may include a ceramic or metal filler in order to reinforce durability, reinforce strength, compensate for a thermal expansion coefficient, and control a dielectric constant.

Various colors may be realized on an upper portion of the first circuit substrate 20 in consideration of design and improving esthetics for a user. In particular, various colors may be realized on the resin layer 29a disposed on the upper portion of the first circuit substrate 20 to improve esthetics for the user, and to cover the at least one sensor electrode 21 disposed in the first circuit substrate 20.

The at least one sensor electrode 21 provided on the first circuit layer 24 may be provided in the first circuit substrate 20 and be adjacent to a surface of the first circuit substrate 20 exposed to the outside in order to contact the portion of the body of the user.

The second circuit substrate 30 may be provided under the integrated circuit 10 and electrically connected to the first circuit substrate 20. Thus, the signal sensed by the at least one sensor electrode 21 is transmitted to the integrated circuit 10 through the at least one signal transmission path 23 formed on the first circuit substrate 20, and the signal calculated by the integrated circuit 10 is transmitted to the second circuit substrate 30. The signal transmitted to the second circuit substrate 30 may be transmitted to other electric parts through an output terminal (not shown) formed on one end portion of the second circuit substrate 30.

The second circuit substrate 30 may include a rigid printed circuit board, a flexible printed circuit board, a rigid-flexible printed circuit board (a substrate including a rigid portion and a flexible portion), and a rigid-flexible separated-connected printed circuit board (a substrate formed by connecting a rigid printed circuit board to a flexible printed circuit board and including a rigid portion and a flexible portion).

The molding layer 40 is provided under the first circuit substrate 20 and protects the integrated circuit 10 from external impact and external environmental factors such as change of temperature, change of moisture, and the like. The molding layer 40 may surround the integrated circuit 10.

In order to reinforce strength, compensate for a thermal expansion coefficient, and control a dielectric constant of the molding layer 40, the molding layer 40 may include a ceramic or metal filler.

The connecting part 50 may electrically connect the first circuit substrate 20 to the second circuit substrate 30. The connecting part 50 may include a through mold via configured to pass through the molding layer 40 and electrically connect the first circuit substrate 20 to the second circuit substrate 30. The connecting part 50 may be filled with a conductive material such that the signal of the integrated circuit 10 is transmitted to the second circuit substrate 30.

The connecting part 50 may be connected to the second circuit substrate 30 through one of a gold-tin eutectic connection, an ACA/NCA connection, a solder connection, and a gold-gold connection. The solder connection may include throughhole soldering and hot bar soldering.

The first circuit substrate 20 and the integrated circuit 10 may be electrically connected through a connecting member 60. In particular, in order to transmit the signal sensed from the at least one sensor electrode 21 to the integrated circuit 10 through the at least one signal transmission path 23, the electrode 28 provided on the second circuit layer 25 may be electrically connected to the integrated circuit 10 through the connecting member 60. The connecting member 60 may include a solder bump.

As shown in FIGS. 3 to 5B, a receiving recess 70 recessed toward the integrated circuit 10 may be formed on a bottom surface of the molding layer 40. The second circuit substrate 30 may be received in the receiving recess 70 and spaced apart from a structure (not shown) disposed under the molding layer 40.

When the fingerprint recognition device 1 is used as a mechanical button, the structure disposed under the molding layer 40 may include a dome switch (not shown).

When the fingerprint recognition device is used as the mechanical button, the bottom surface of the molding layer 40 may come in contact with the structure disposed under the molding layer 40 or be pressed by the structure disposed under the molding layer 40, and when the connecting part 50 or the second circuit substrate 30 comes in contact with the structure, the connecting part 50 or the second circuit substrate 30 may be damaged, and thus the second circuit substrate 30 may be outside of a lower pressure concentration portion (a portion at which the bottom surface of the molding layer comes in contact with the structure or a portion at which the molding layer is pressed by the structure disposed under the molding layer) 80 formed on the bottom surface of the molding layer 40 and be received in the receiving recess 70.

Generally, the lower pressure concentration portion 80 may be formed on a central portion of the bottom surface of the molding layer 40. The receiving recess 70 may be formed to pass through between the lower pressure concentration portions 80 formed on the central portion of the bottom surface of the molding layer 40. That is, the lower pressure concentration portion 80 may be disposed on a left side and a right side of the receiving recess 70. Also, the receiving recess 70 may be outside of the lower pressure concentration portion 80 formed at the central portion and formed on a side portion of the bottom surface of the molding layer 40, or may be formed on one end portion of the bottom surface of the molding layer 40.

The lower pressure concentration portion 80 may be formed on an edge portion of the bottom surface of the molding layer 40. The lower pressure concentration portion 80 may be formed at various positions based on structures disposed under the molding layer 40, and is not limited to the central portion of the bottom surface of the molding layer 40 or the edge portion of the bottom surface of the molding layer 40.

The receiving recess 70 may be bent and outside of the lower pressure concentration portion 80, and the second circuit substrate 30 received in the bent receiving recess 70 may also be bent.

A connecting part (not shown) which protrudes toward the structure or is recessed toward the integrated circuit may be formed on the bottom surface of the molding layer 40 so that the structure (not shown) disposed under the molding layer 40 connected to the molding layer 40.

The fingerprint recognition device 1 may further include a fixing layer 90. In order to fix the second circuit substrate 30 to the receiving recess 70, the fixing layer 90 may be formed between the receiving recess 70 and the second circuit substrate 30. Also, the fixing layer 90 may be formed under the second circuit substrate 30 to face the structure (not shown) disposed under the molding layer 40, and support the second circuit substrate 30 received in the receiving recess 70. The fixing layer 90 may surround the entire second circuit substrate 30 received in the receiving recess 70. Also, the fixing layer 90 may be formed between the receiving recess 70 and the second circuit substrate 30 to cover a portion of the second circuit substrate 30. The fixing layer 90 may be formed in various shapes so that the second circuit substrate 30 may not be separated from the receiving recess 70.

The fixing layer 90 may include at least one among an epoxy resin, an acrylic resin, a silicone resin, and a urethane resin.

Figure 6:
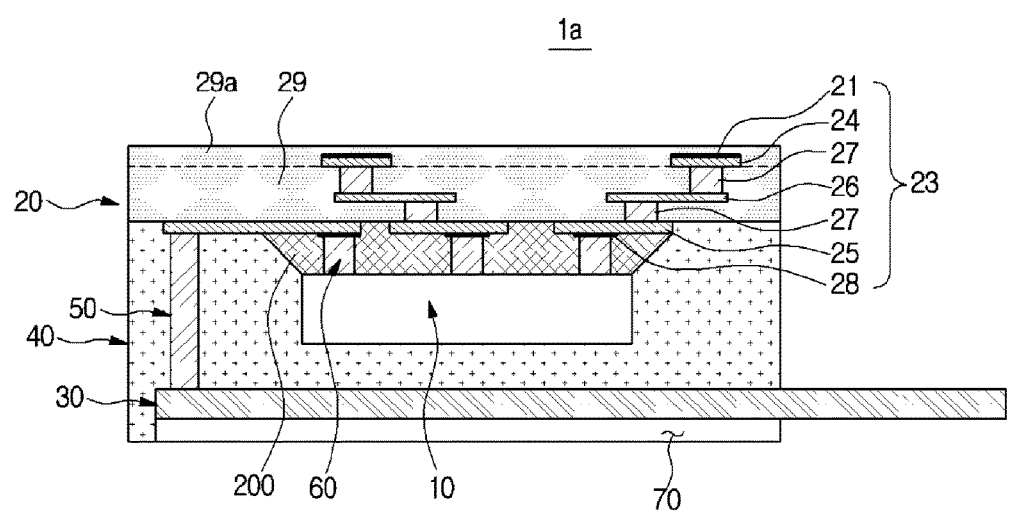
FIG. 6 is a view illustrating a structure including an underfill resin layer in a fingerprint recognition device according to one embodiment of the present invention.

FIG. 6 is a view illustrating a structure including an underfill resin layer in a fingerprint recognition device according to one embodiment of the present invention.

As shown in FIG. 6, a fingerprint recognition device 1a may further include an underfill resin layer 200. In order to reinforce durability of a connecting member 60 configured to electrically connect a first circuit substrate 20 to an integrated circuit 10, the underfill resin layer 200 may be formed between a lower surface of the first circuit substrate 20 facing an integrated circuit 10 and the integrated circuit 10. The underfill resin layer 200 may be formed to surround the connecting member 60.

Figure 7:
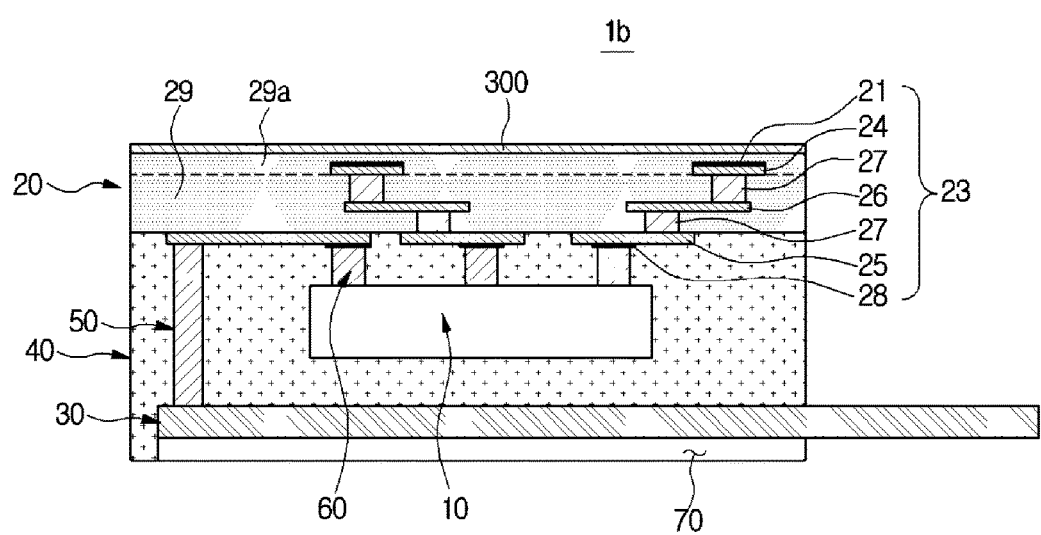
FIG. 7 is a view illustrating a structure including a coating layer in a fingerprint recognition device according to one embodiment of the present invention.

FIG. 7 is a view illustrating a structure including a coating layer in a fingerprint recognition device according to one embodiment of the present invention.

As shown in FIG. 7, a fingerprint recognition device 1b may further include a coating layer 300.

The coating layer 300 may be provided on an upper portion of a first circuit substrate 20. Various colors and patterns may be formed on the coating layer 300. The various patterns or shapes formed on the coating layer 300 may be displayed on the coating layer 300 through at least one among printing, carving, and a laser process. Also, the various patterns or shapes may be attached on the coating layer 300 in the form of a sticker. A display method of the patterns or the shapes is not limited to the above embodiments.

Figure 8:
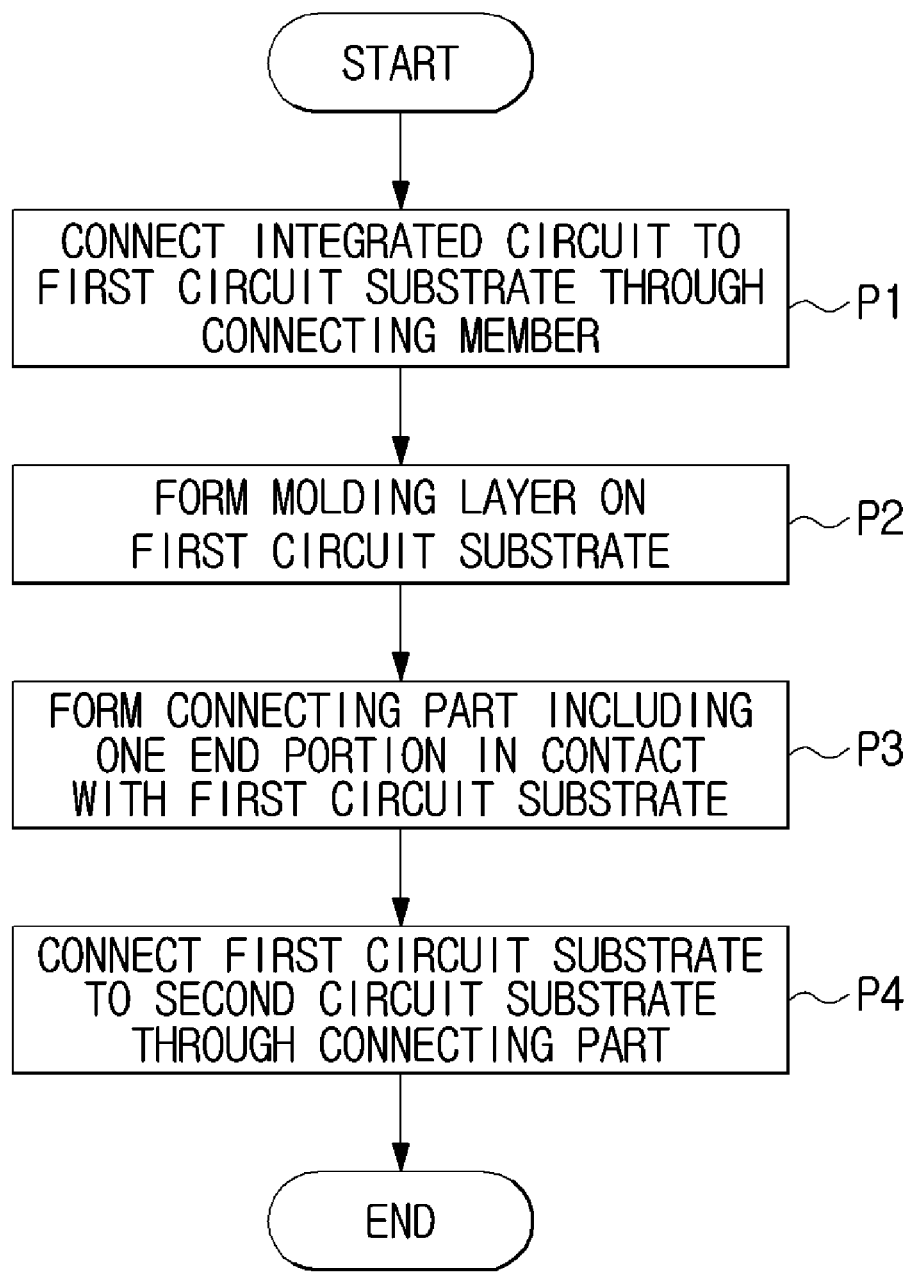
FIG. 8 is a flow chart illustrating a method of manufacturing a fingerprint recognition device according to one embodiment of the present invention.

FIG. 8 is a flow chart illustrating a method of manufacturing a fingerprint recognition device according to one embodiment of the present invention.

As shown in FIG. 8, the method of manufacturing the fingerprint recognition device includes electrically connecting an integrated circuit to a first circuit substrate on which at least one sensor electrode is provided through a connecting member (P1), forming a molding layer configured to surround the integrated circuit on the first circuit substrate of a plurality of layers to protect the integrated circuit from the outside (P2), forming a connecting part having one end portion contacting the first circuit substrate of the plurality of layers (P3), and electrically connecting the first circuit substrate of the plurality of layers to the second circuit substrate so that the other portion end of the connecting part is in contact with the second circuit substrate.

The molding layer may be formed using a mold. In particular, after electrically connecting the integrated circuit to the first circuit substrate on which at least one sensor electrode is provided through the connecting member, the mold is covered and the molding layer is formed. By molding after forming a receiving recess on the mold, the receiving recess configured to receive the second circuit substrate may be formed on a bottom surface of the molding layer.

Figure 9:
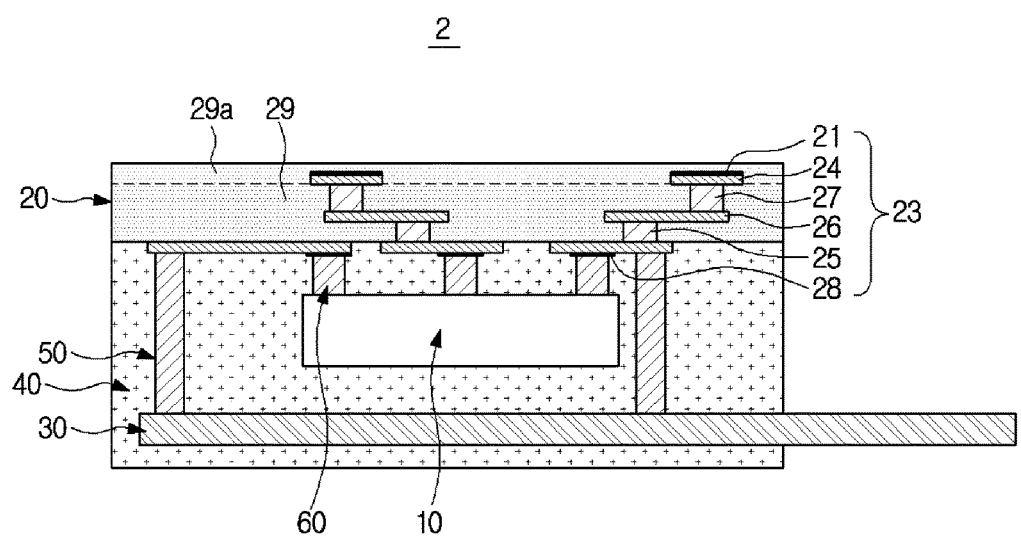
FIG. 9 is a cross-sectional view illustrating a fingerprint recognition device according to another embodiment of the present invention.
Figure 10:
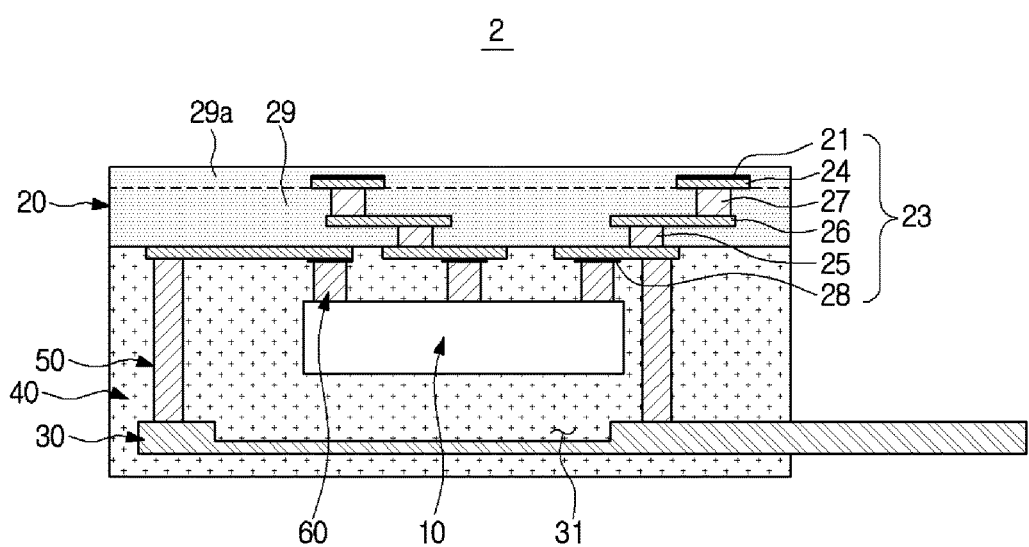
FIG. 10 is a cross-sectional view illustrating a structure in which a recess part is formed on a second circuit board of the fingerprint recognition device according to another embodiment of the present invention.
Figure 11:
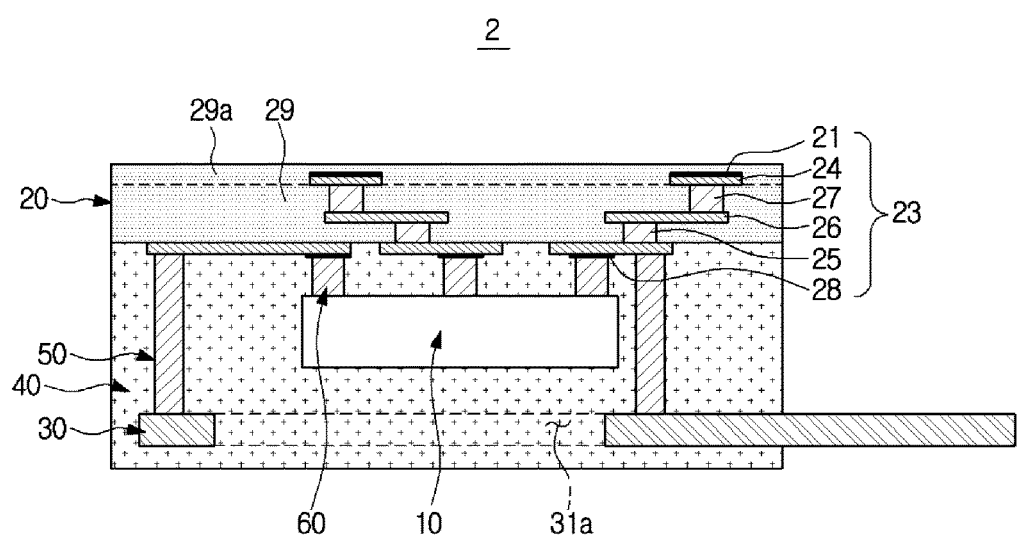
FIG. 11 is a cross-sectional view illustrating a structure in which a punching part is formed on the second circuit board of the fingerprint recognition device according to another embodiment of the present invention.
Figure 12:
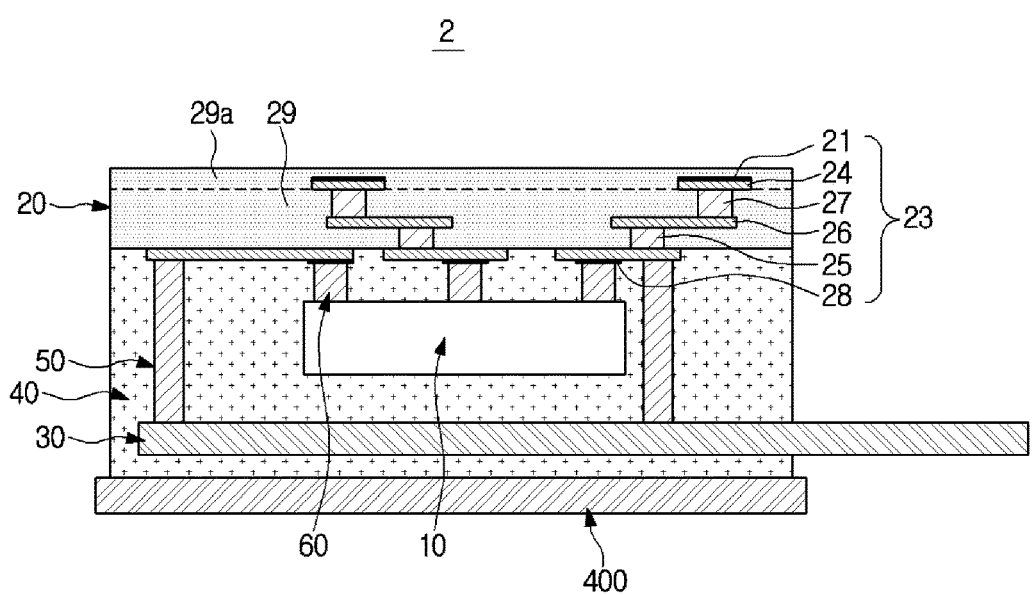
FIG. 12 is a cross-sectional view illustrating a structure in which a reinforcing layer is formed in the fingerprint recognition device according to another embodiment of the present invention.

FIG. 9 is a cross-sectional view illustrating a fingerprint recognition device according to another embodiment of the present invention, FIG. 10 is a cross-sectional view illustrating a structure in which a recess part is formed on a second circuit board of the fingerprint recognition device according to another embodiment of the present invention, FIG. 11 is a cross-sectional view illustrating a structure in which a punching part is formed on the second circuit board of the fingerprint recognition device according to another embodiment of the present invention, and FIG. 12 is a cross-sectional view illustrating a structure in which a reinforcing layer is formed in the fingerprint recognition device according to another embodiment of the present invention. Hereinafter, any repetitive description of FIGS. 1 to 8 will be omitted. Also, un-described numerical references will be understood with reference to FIGS. 1 to 8.

As shown in FIGS. 9 to 12, a fingerprint recognition device 2 may include an integrated circuit 10, a first circuit substrate 20, a second circuit substrate 30, a molding layer 40, and a connecting part 50.

The first circuit substrate 20 disposed on an upper portion of the integrated circuit 10 may have a structure in which a plurality of circuits 24, 25, and 26 are stacked.

The second circuit substrate 30 may be provided under the integrated circuit 10 and electrically connected to the first circuit substrate 20. Thus, a signal sensed by at least one sensor electrode 21 is transmitted to the integrated circuit 10 through at least one signal transmission path 23 formed on the first circuit substrate 20, and a signal calculated by the integrated circuit 10 is transmitted to the second circuit substrate 30. The signal transmitted to the second circuit substrate 30 may be transmitted to another electric part through an output terminal (not shown) formed on one end portion of the second circuit substrate 30.

At least one of a recess part 31 and a punching part 31a may be formed on the second circuit substrate 30.

The recess part 31 that is recessed more away from the first circuit substrate 20 may be formed on the second circuit substrate 30.

The recess part 31 may be disposed under the integrated circuit 10 to correspond to the integrated circuit 10.

Alternatively, the punching part 31a may be formed on the second circuit substrate 30.

The punching part 31a may be disposed under the integrated circuit 10 to correspond to the integrated circuit 10. Since the punching part 31a is formed on the second circuit substrate 30, the second circuit substrate 30 may be non-continuously disposed under the integrated circuit 10.

Alternatively, both of the recess part 31 and the punching part 31a may be formed on the second circuit substrate 30.

In order to reinforce strength, the molding layer 40 may be filled in the recess part 31 and the punching part 30a. That is, the molding layer 40 formed of a rigid material may be filled in the recess part 31 and the punching part 31a disposed under the integrated circuit 10 and the strength of the fingerprint recognition device 2 may be reinforced.

The molding layer 40 is provided under the first circuit substrate 20, and protects the integrated circuit 10 from external impact and external environmental factors such as change of temperature, change of moisture, and the like. The molding layer 40 may surround the integrated circuit 10.

The molding layer 40 may surround the second circuit substrate 30 as well as the integrated circuit 10 to protect the second circuit substrate 30 from external impact and external environmental factors such as change of temperature, change of moisture, and the like. Thus, the molding layer 40 may be disposed above and below the second circuit substrate 30.

The receiving recess 70 may be omitted.

The connecting part 50 may include at least one among a through mold via and a solder ball configured to pass through the molding layer 40 and electrically connect the first circuit substrate 20 to the second circuit substrate 30.

The fingerprint recognition device 2 may further include a reinforcing layer 400.

The reinforcing layer 400 may be disposed under the second circuit substrate 30 to improve durability of the fingerprint recognition device 2.

The reinforcing layer 400 may be disposed under the molding layer 40.

The reinforcing layer 400 may include a metal. The metal may include steel use stainless (SUS).

Figure 13:
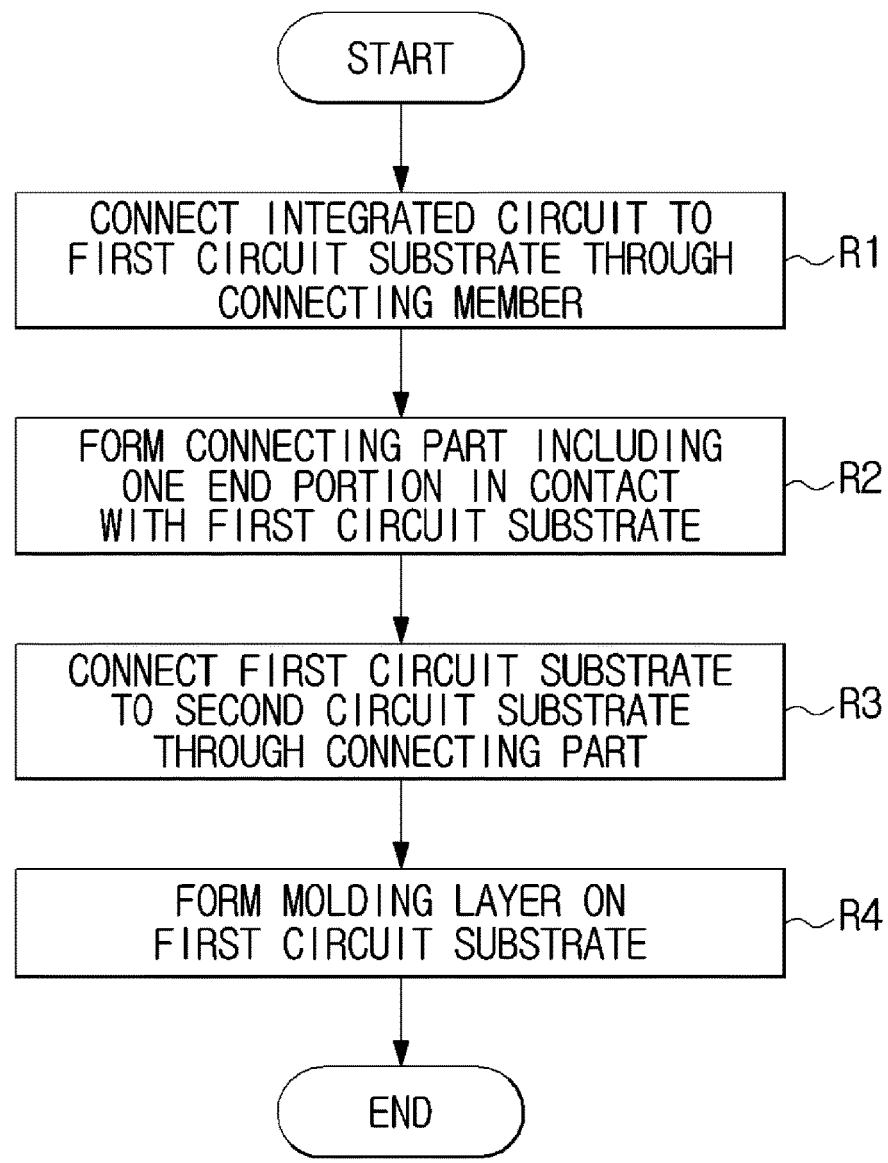
FIG. 13 is a flow chart illustrating a method of manufacturing a fingerprint recognition device according to another embodiment of the present invention.

FIG. 13 is a flow chart illustrating a method of manufacturing a fingerprint recognition device according to another embodiment of the present invention.

As shown in FIG. 13, the method of manufacturing the fingerprint recognition device includes connecting an integrated circuit to a first circuit substrate on which at least one sensor electrode is provided through a connecting member (R1), forming a connecting part having one end portion contacting the first circuit substrate of a plurality of layers (R2), electrically connecting the first circuit substrate of the plurality of layers to the second circuit substrate to be in contact with the other end portion of the connecting part to the second circuit substrate (R3), and forming a molding layer configured to surround the integrated circuit and the second circuit substrate on the first circuit substrate of the plurality of layers to protect the integrated circuit from the outside (R4).

Figure 14:
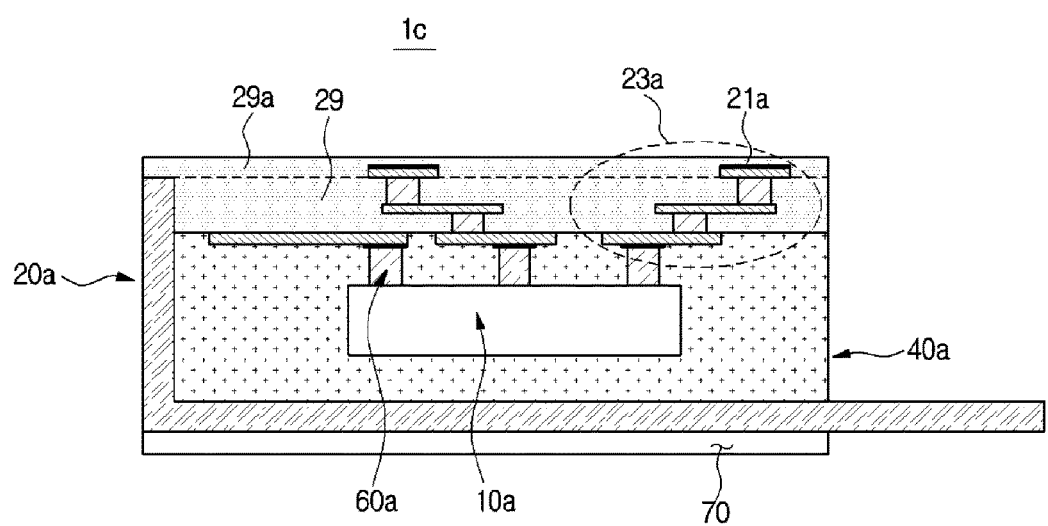
FIG. 14 is a cross-sectional view illustrating a fingerprint recognition device according to still another embodiment of the present invention.

FIG. 14 is a cross-sectional view illustrating a fingerprint recognition device according to still another embodiment of the present invention.

As shown in FIG. 14, a fingerprint recognition device 1c may include an integrated circuit 10a, a first circuit substrate 20a, a connecting member 60a, and a molding layer 40a. In FIG. 9, any description concerning the same parts described above may be omitted.

Since the integrated circuit 10a is a structural unit configured to calculate and process the signal sensed by the at least one sensor electrode 21a, the integrated circuit 10a is electrically connected to the at least one sensor electrode 21a.

The first circuit substrate 20a may be disposed on an upper portion of the integrated circuit 10a, at least one signal transmission path 23a may be disposed thereinside, so that the signal sensed by the at least one sensor electrode 21a may be transmitted to the integrated circuit 10a. The first circuit substrate 20a may have a structure in which a plurality of circuit layers rearranged to transmit the signal sensed by the at least one sensor electrode 21a to the integrated circuit 10a are stacked, and may include a rigid-flexible printed circuit board and a rigid-flexible separated-connected printed circuit board.

The at least one sensor electrode 21a may be provided in the first circuit substrate 20a and be adjacent to a surface of the first circuit substrate 20a.

The first circuit substrate 20a may be bent with two facing portions between which the integrated circuit 10a is interposed. In particular, one end portion of the first circuit substrate 20a may be received in a receiving recess 70a formed on a bottom surface of the molding layer 40a provided under the first circuit substrate 20a to protect the integrated circuit 10a from the outside. An output terminal (not shown) may be provided on the one end portion of the first circuit substrate 20a received in the receiving recess 70a, and the signal sensed by the at least one sensor electrode 21a may be transmitted to other electronic device. Since the first circuit substrate 20a provided above and below the integrated circuit 10a is integrally formed, a connecting part configured to electrically connect the first circuit substrate 20a provided on and under the integrated circuit 10a may be omitted.

The integrated circuit 10a and the first circuit substrate 20a may be electrically connected by the connecting member 60a. The connecting member 60a may be provided between the integrated circuit 10 and the first circuit substrate 20a disposed on an upper portion of the integrated circuit 10a. The connecting member 60 may include a solder pump.

Figure 15:
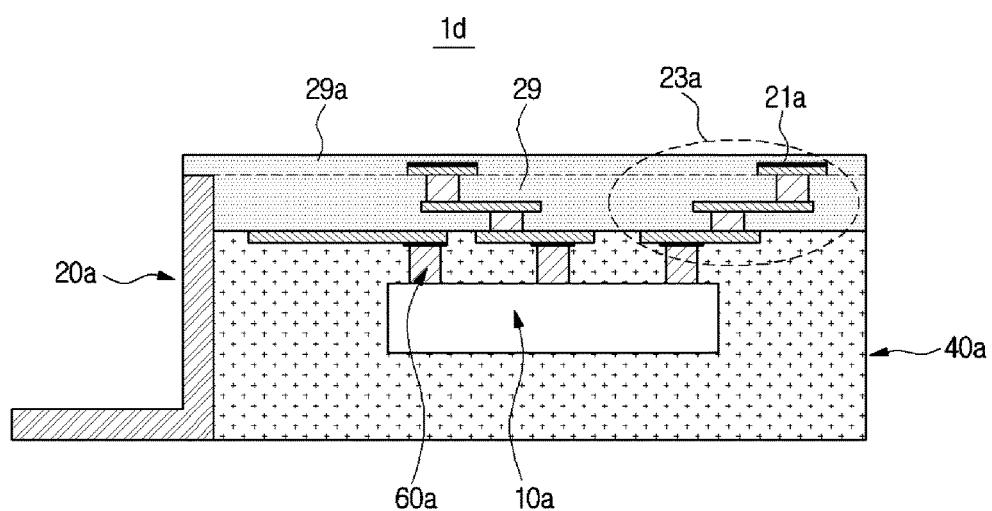
FIG. 15 is a cross-sectional view illustrating a fingerprint recognition device according to still another embodiment of the present invention.

FIG. 15 is a cross-sectional view illustrating a fingerprint recognition device according to still another embodiment of the present invention.

As shown in FIG. 15, a fingerprint recognition device 1d may include an integrated circuit 10b, a first circuit substrate 20b, a connecting member 60b, and a molding layer 40b. In FIG. 10, any description concerning the same parts described above may be omitted.

The first circuit substrate 20b is disposed on an upper portion of the integrated circuit 10b, and at least one signal transmission path 23b configured to transmit a signal sensed by at least one sensor electrode 21b to the integrated circuit 10b may be formed in the first circuit substrate 20b.

In order to protect the integrated circuit 10b from the outside, the molding layer 40b may be provided under the first circuit substrate 20b and surround the connecting member 60b configured to electrically connect the integrated circuit 10b to the first circuit substrate 20b and the integrated circuit 10b.

One end portion of the first circuit substrate 20b may be bent away from the integrated circuit 10b along the molding layer 40b. When the one end portion of the first circuit substrate 20b is bent away from the integrated circuit 10b, an additional receiving recess (not shown) may not be formed on a bottom surface of the molding layer 40b.

Figure 16:
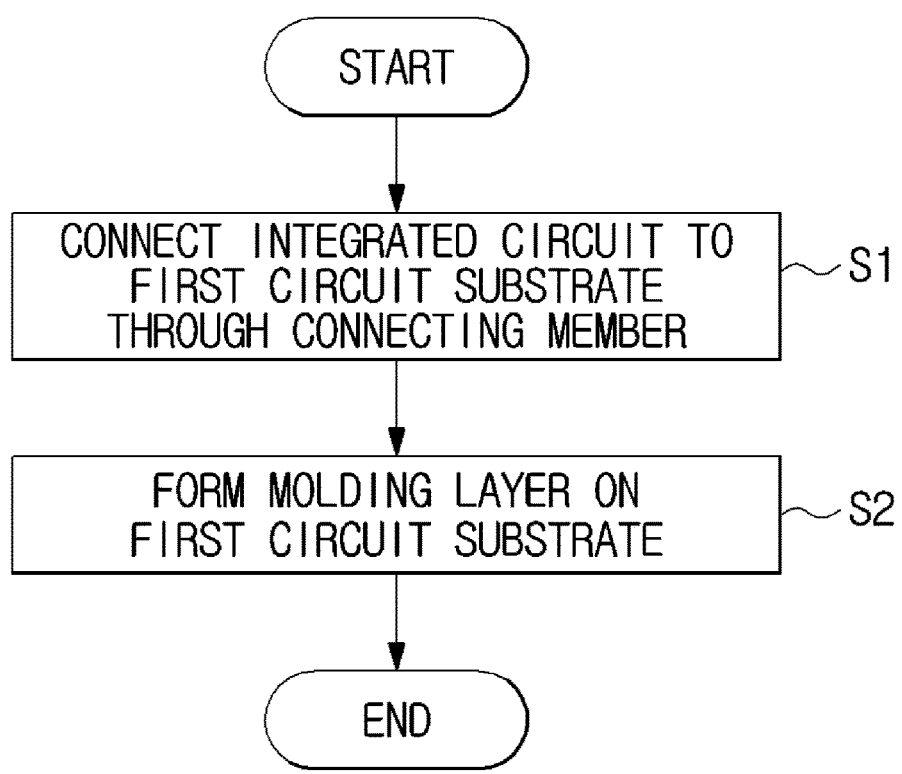
FIG. 16 is a flow chart illustrating a method of manufacturing the fingerprint recognition devices of FIGS. 14 and 15.

FIG. 16 is a flow chart illustrating a method of manufacturing the fingerprint recognition devices of FIGS. 14 and 15.

As shown in FIG. 16, the method of manufacturing the fingerprint recognition device includes connecting an integrated circuit to a first circuit substrate on which at least one sensor electrode is provided through a connecting member (S1), and forming a molding layer configured to surround the integrated circuit on the first circuit substrate and protect the integrated circuit from the outside (S2).

Figure 17:
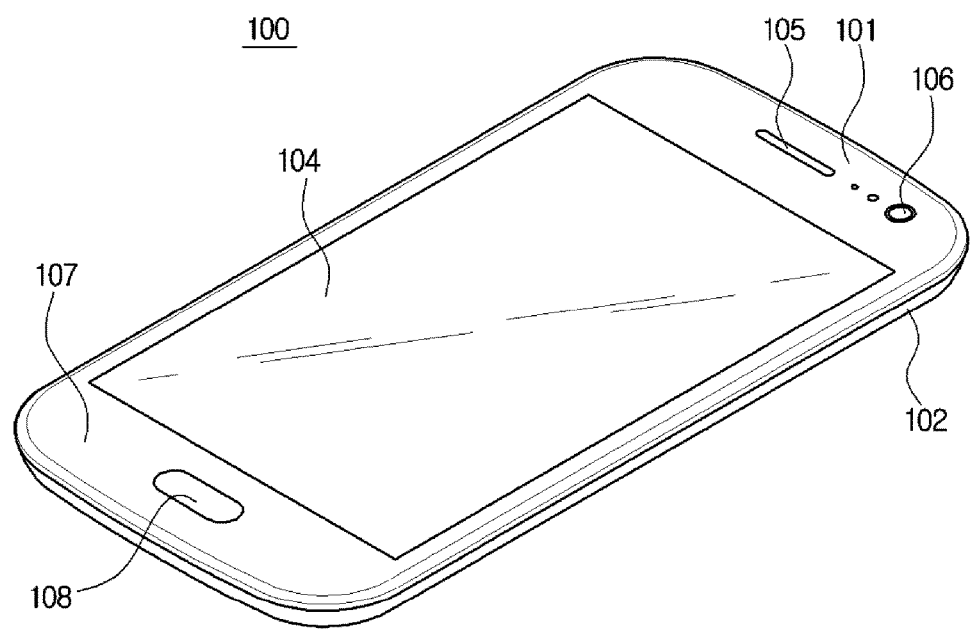
FIG. 17 is a perspective view illustrating an electronic device according to one embodiment of the present invention.
Figure 18:
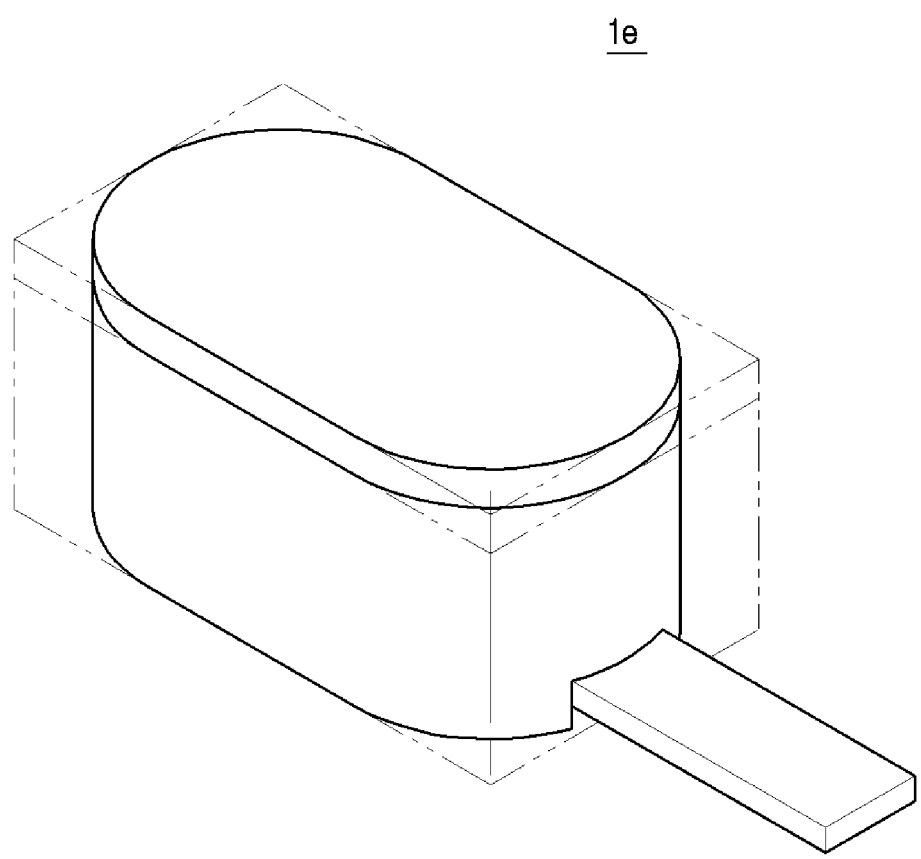
FIG. 18 is an enlarged view illustrating a portion of the electronic device shown in FIG. 17.

FIG. 17 is a perspective view illustrating an electronic device according to one embodiment of the present invention, and FIG. 18 is an enlarged view illustrating a portion of the electronic device shown in FIG. 17.

As shown in FIGS. 17 and 18, an electronic device 100 includes a body in a bar shape. However, the body of the electronic device 100 is not limited to the bar shape, but bodies of various structures such as a slide type, a folder type, a swing type, a swivel type, and the like which are relatively movably combined may be applied.

The body includes a casing forming an external shape. The body may include a front casing 101, a rear casing 102, and a battery cover (not shown). Various electric parts are installed in a space formed between the front casing 101 and the rear casing 102. At least one middle casing may be additionally disposed between the front casing 101 and the rear casing 102.

The casing may be formed by ejecting synthetic resin or to include metal such as stainless steel (STS), aluminum (Al), titanium (Ti), and the like.

A display module 104, a sound output part 105, a camera 106, a user input part 107, a microphone (not shown), an interface (not shown), and the like may be disposed on the body of the electronic device, mainly the front casing 101.

The display module 104 covers most of a main surface of the front casing 101. The sound output part 105 and the camera 106 are disposed in an area adjacent to one end portion among both end portions of the display module 104, and the user input part 107 and the microphone (not shown) are disposed in an area adjacent to the other end portion. The user input part 107, the interface (not shown), and the like may be disposed on side surfaces of the front casing 101 and the rear casing 102.

The user input part 107 may be operated to receive a command configured to control an operation of the electronic device 100, and may include a plurality of manipulating units (not shown). The manipulating units may be referred to as manipulating portions, and may use any tactile method of manipulation through a tactile sense of a user.

A home key 108 including a fingerprint recognition device (not shown) may be formed in the user input part 107. At least one sensor electrode is provided in the fingerprint recognition device, and the at least one sensor electrode senses a difference (an electrostatic signal) in capacitance generated by a difference in electric characteristics between valleys and ridges of a fingerprint. The electrostatic signal may be transformed into an electric signal and amplified by an amplifier (not shown), and transmitted to a microcomputer of the electronic device 100 through a connector such as a printed circuit board (not shown).

A fingerprint recognition device 1e may be used as the home key 108 itself without an additional packaging process.

A curved surface may be formed at a periphery of the fingerprint recognition device 1e through a numerical process.

In order to perform the numerical process, the fingerprint recognition device 1e is disposed on an additional structure (not shown). For an effective numerical process, in order to fix the fingerprint recognition device 1e to the additional structure, a fixing part (not shown) may be formed on a bottom surface of the fingerprint recognition device 1e. In particular, the fixing part may be formed on a bottom surface of a molding layer of the fingerprint recognition device 1e, and may have a shape protruding toward the additional structure or recessed toward the inside of the fingerprint recognition device 1e.

The fingerprint recognition device may be used to support a user identification mode using an electric field, a capacitor, a thermistor, and the like.

The user identification mode is a mode configured to perform user identification by bringing a portion of a body such as a finger in contact with a fingerprint recognition sensor. For example, when the user puts his or her finger on the fingerprint recognition device, the fingerprint recognition sensor provided on the fingerprint recognition device recognizes the fingerprint of the user, compares it with previously stored fingerprint data, and verifies whether the corresponding user is a legitimate user who has permission to perform control authority or access content.

The fingerprint recognition device may be provided on any device requiring a user identification process. For example, electronic devices such as an information terminal, a smartphone, a gaming device, a PMP, a tablet PC, a camera, and the like, a medical device, or an ATM may be included.

Although specific embodiments were illustrated and described above, the present invention should not be construed as limited to the example embodiments set forth herein and may be embodied by those skilled in the art in many alternative forms within the spirit and scope of the claims of the invention.

The invention claimed is:

1. A fingerprint recognition device comprising:
an integrated circuit electrically connected to at least one sensor electrode;

a first circuit substrate disposed on an upper portion of the integrated circuit, and on which the at least one sensor electrode is provided;
a second circuit substrate electrically connected to the first circuit substrate and disposed under the integrated circuit;
a molding layer provided under the first circuit substrate and configured to surround the integrated circuit to protect the integrated circuit from the outside; and
a connecting part electrically connecting the first circuit substrate to the second circuit substrate,
wherein the first circuit substrate comprises a structure in which a plurality of circuit layers are rearranged to transmit a signal sensed by the at least one sensor electrode to the integrated circuit.

2. The fingerprint recognition device of claim 1, wherein the at least one sensor electrode is provided on a surface of the first circuit substrate which is exposed to the outside.

3. The fingerprint recognition device of claim 1, wherein the at least one sensor electrode is provided in the first circuit substrate and is adjacent to a surface of the first circuit substrate which is exposed to the outside.

4. The fingerprint recognition device of claim 1, wherein at least one signal transmission path is formed on the first circuit substrate to transmit the signal sensed by the at least one sensor electrode to the integrated circuit, and
wherein the at least one signal transmission path comprises:
a first circuit layer on which the at least one sensor electrode is disposed;
a second circuit layer on which an electrode provided under the first circuit substrate is disposed; and
a micro via electrically connecting the first circuit to the second circuit.

5. The fingerprint recognition device of claim 4, wherein the at least one signal transmission path further comprises at least one third circuit layer disposed between the first circuit layer and the second circuit layer,
wherein the micro via electrically connects the first circuit layer, the at least one third circuit layer, and the second circuit layer which have a stacked structure.

6. The fingerprint recognition device of claim 4, wherein, in order to transmit the signal sensed by the at least one sensor electrode to the integrated circuit through the at least one signal transmission path, the electrode is electrically connected to the integrated circuit through a connecting member.

7. The fingerprint recognition device of claim 1, wherein a receiving recess recessed toward the integrated circuit is formed on a bottom surface of the molding layer, and
the second circuit substrate is received in the receiving recess and separated from a structure disposed under the molding layer.

8. The fingerprint recognition device of claim 7, wherein the receiving recess and the second circuit substrate received in the receiving recess are bent.

9. The fingerprint recognition device of claim 7, wherein the receiving recess is formed on a central portion of the bottom surface of the molding layer.

10. The fingerprint recognition device of claim 7, wherein the receiving recess is formed on a side portion of the bottom surface of the molding layer.

11. The fingerprint recognition device of claim 7, wherein the receiving recess is formed on one end portion of the bottom surface of the molding layer.

12. The fingerprint recognition device of claim 1, wherein at least one of a recessed portion and a punching portion is formed on the second circuit substrate, and
the at least one of the recessed portion and the punching portion is filled by the molding layer.

13. The fingerprint recognition device of claim 1, wherein a receiving recess recessed toward the integrated circuit is formed on a bottom surface of the molding layer, and
one end portion of the first circuit substrate is bent to face a lower surface of the integrated circuit and received in the receiving recess.

14. The fingerprint recognition device of claim 1, wherein one end portion of the first circuit substrate is bent away from the integrated circuit along the molding layer.

15. The fingerprint recognition device of claim 1, wherein the first circuit substrate comprises a structure in which a plurality of circuit layers are rearranged to transmit a signal sensed by the at least one sensor electrode to the integrated circuit, and
the first circuit substrate comprises a rigid-flexible printed circuit board and a rigid-flexible separated-connected printed circuit board.

16. A method of manufacturing a fingerprint recognition device, comprising:
electrically connecting an integrated circuit to a first circuit substrate on which at least one sensor electrode is provided through a connecting member; and
forming a molding layer configured to surround the integrated circuit on the first circuit substrate to protect the integrated circuit from the outside,
wherein the first circuit substrate comprises a structure in which a plurality of circuit layers are rearranged to transmit a signal sensed by the at least one sensor electrode to the integrated circuit.

17. The method of manufacturing the fingerprint recognition device of claim 16, wherein the first circuit substrate is formed by stacking the plurality of circuit layers.

18. An electronic device using a fingerprint recognition device, the electronic device comprising:
an integrated circuit electrically connected to at least one sensor electrode;
a first circuit substrate disposed on an upper portion of the integrated circuit and on which the at least one sensor electrode is provided;
a second circuit substrate electrically connected to the first circuit substrate and disposed under the integrated circuit; and
a molding layer provided under the first circuit substrate and configured to surround the integrated circuit to protect the integrated circuit from the outside, and
wherein a curved surface is formed at a periphery of the fingerprint recognition device, and
wherein the first circuit substrate comprises a structure in which a plurality of circuit layers are rearranged to transmit a signal sensed by the at least one sensor electrode to the integrated circuit.

19. The electronic device of claim 18, wherein a receiving recess recessed toward the integrated circuit is formed on a bottom surface of the molding layer, and
the second circuit substrate is received in the receiving recess and spaced apart from the structure.

* * * * *